United States Patent
Hatano et al.

(10) Patent No.: US 9,425,371 B2
(45) Date of Patent: Aug. 23, 2016

(54) LIGHT-EMITTING DEVICE AND ELECTRONIC DEVICE

(71) Applicant: SEMICONDUCTOR ENERGY LABORATORY CO., LTD., Atsugi-shi, Kanagawa-ken (JP)

(72) Inventors: Kaoru Hatano, Kanagawa (JP); Satoshi Seo, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/165,810

(22) Filed: Jan. 28, 2014

(65) Prior Publication Data
US 2014/0138733 A1    May 22, 2014

Related U.S. Application Data

(63) Continuation of application No. 13/868,143, filed on Apr. 23, 2013, now Pat. No. 8,766,314, and a continuation of application No. 13/547,081, filed on Jul. 12, 2012, now Pat. No. 8,450,769, and a continuation of application No. 12/636,409, filed on Dec. 11, 2009, now Pat. No. 8,222,666.

(30) Foreign Application Priority Data

Dec. 17, 2008  (JP) .................................. 2008-320939

(51) Int. Cl.
*H01L 29/22*    (2006.01)
*H01L 29/26*    (2006.01)
(Continued)

(52) U.S. Cl.
CPC ............ *H01L 33/62* (2013.01); *H01L 27/3276* (2013.01); *H01L 51/003* (2013.01); *H01L 2227/326* (2013.01); *H01L 2251/5338* (2013.01); *H01L 2924/0002* (2013.01)

(58) Field of Classification Search
CPC .. H01L 33/62; H01L 27/3276; H01L 27/3262

USPC ................. 257/99, 79, 98, E33.053, E33.066
See application file for complete search history.

(56) References Cited

U.S. PATENT DOCUMENTS 6,127,199 A    10/2000  Inoue et al.
6,372,608 B1   4/2002   Shimoda et al.
(Continued)

FOREIGN PATENT DOCUMENTS

EP    1 122 794 A2    8/2001
EP    1349208 A       10/2003
(Continued)

OTHER PUBLICATIONS

International Search Report (Application No. PCT/JP2009/070789;PCT12079) Dated Jan. 19, 2010.
(Continued)

*Primary Examiner* — Luan C Thai
(74) *Attorney, Agent, or Firm* — Nixon Peabody LLP; Jeffrey L. Costellia

(57) ABSTRACT

An object is to provide a light-emitting device having a structure in which an external connection portion can easily be connected and a method for manufacturing the light-emitting device. A light-emitting device includes a lower support 110, a base insulating film 112 over the lower support 110 which has a through-hole 130, a light-emitting element 127 over the base insulating film 112, and an upper support 122 over the light-emitting element 127. An electrode 131 is provided in the through-hole 130, and the external connection terminal 132 electrically connected to the electrode 131 is provided below the base insulating film 112. The external connection terminal 132 is electrically connected to the external connection portion 133 and functions as a terminal that inputs a signal or a power supply into the light-emitting device. This light-emitting device has a structure in which an external connection portion can easily be connected.

19 Claims, 8 Drawing Sheets

(51) Int. Cl.
*H01L 33/00* (2010.01)
*H01L 33/62* (2010.01)
*H01L 27/32* (2006.01)
*H01L 51/00* (2006.01)

(56) References Cited

U.S. PATENT DOCUMENTS

| | | | |
|---|---|---|---|
| 6,781,152 B2 | 8/2004 | Yamazaki | |
| 6,822,264 B2 | 11/2004 | Yamazaki et al. | |
| 6,822,391 B2 | 11/2004 | Yamazaki et al. | |
| 6,849,877 B2 | 2/2005 | Yamazaki et al. | |
| 6,952,020 B1* | 10/2005 | Yamazaki et al. | 257/59 |
| 6,956,325 B2 | 10/2005 | Yamazaki et al. | |
| 6,992,439 B2 | 1/2006 | Yamazaki et al. | |
| 7,045,861 B2 | 5/2006 | Takayama et al. | |
| 7,060,153 B2 | 6/2006 | Yamazaki et al. | |
| 7,067,976 B2 | 6/2006 | Yamazaki | |
| 7,119,364 B2 | 10/2006 | Yamazaki | |
| 7,129,102 B2 | 10/2006 | Yamazaki | |
| 7,129,523 B2 | 10/2006 | Yamazaki et al. | |
| 7,211,828 B2 | 5/2007 | Yamazaki et al. | |
| 7,314,785 B2 | 1/2008 | Yamazaki et al. | |
| 7,335,573 B2 | 2/2008 | Takayama et al. | |
| 7,372,200 B2 | 5/2008 | Yamazaki | |
| 7,420,208 B2 | 9/2008 | Yamazaki et al. | |
| 7,443,097 B2 | 10/2008 | Yamazaki et al. | |
| 7,629,617 B2 | 12/2009 | Yamazaki et al. | |
| 7,718,463 B2 | 5/2010 | Yamazaki et al. | |
| 7,728,326 B2 | 6/2010 | Yamazaki et al. | |
| 7,736,964 B2 | 6/2010 | Yamamoto et al. | |
| 7,935,967 B2 | 5/2011 | Takayama et al. | |
| 7,952,101 B2 | 5/2011 | Yamazaki et al. | |
| 8,039,288 B2 | 10/2011 | Yamazaki | |
| 8,134,149 B2 | 3/2012 | Yamazaki et al. | |
| 8,164,099 B2 | 4/2012 | Yamazaki et al. | |
| 8,293,552 B2 | 10/2012 | Takayama et al. | |
| 8,415,660 B2 | 4/2013 | Yamazaki et al. | |
| 8,466,482 B2 | 6/2013 | Yamazaki | |
| 8,822,982 B2 | 9/2014 | Yamazaki et al. | |
| 9,105,521 B2 | 8/2015 | Yamazaki | |
| 9,263,469 B2 | 2/2016 | Yamazaki | |
| 2001/0040645 A1 | 11/2001 | Yamazaki | |
| 2003/0034497 A1 | 2/2003 | Yamazaki et al. | |
| 2003/0057422 A1 | 3/2003 | Yamazaki et al. | |
| 2003/0129790 A1 | 7/2003 | Yamazaki et al. | |
| 2004/0099926 A1 | 5/2004 | Yamazaki et al. | |
| 2004/0245924 A1 | 12/2004 | Utsunomiya et al. | |
| 2005/0017255 A1 | 1/2005 | Yamazaki | |
| 2005/0127371 A1 | 6/2005 | Yamazaki et al. | |
| 2005/0224820 A1 | 10/2005 | Yamazaki et al. | |
| 2006/0055314 A1 | 3/2006 | Nakamura et al. | |
| 2006/0081844 A1* | 4/2006 | Hirosue et al. | 257/59 |
| 2007/0082430 A1 | 4/2007 | Yamazaki | |
| 2007/0114921 A1* | 5/2007 | Yamazaki et al. | 313/504 |
| 2007/0164295 A1 | 7/2007 | Yamazaki et al. | |
| 2008/0018229 A1* | 1/2008 | Yamazaki | 313/498 |
| 2008/0303408 A1 | 12/2008 | Yamazaki et al. | |
| 2010/0163859 A1 | 7/2010 | Yamazaki et al. | |
| 2013/0228763 A1 | 9/2013 | Yamazaki et al. | |
| 2013/0277679 A1 | 10/2013 | Yamazaki | |
| 2014/0077199 A1 | 3/2014 | Yamazaki et al. | |
| 2014/0326974 A1 | 11/2014 | Yamazaki et al. | |
| 2014/0346488 A1 | 11/2014 | Yamazaki et al. | |

FOREIGN PATENT DOCUMENTS

| | | |
|---|---|---|
| EP | 1 480 272 A2 | 11/2004 |
| EP | 2261978 A | 12/2010 |
| JP | 62-040797 | 3/1987 |
| JP | 62-040797 U | 3/1987 |
| JP | 3034483 | 2/1997 |
| JP | 10-206896 | 8/1998 |
| JP | 2001-237064 | 8/2001 |
| JP | 2001-290439 A | 10/2001 |
| JP | 2001-331120 | 11/2001 |
| JP | 2002-324667 A | 11/2002 |
| JP | 2003-031778 | 1/2003 |
| JP | 2003-086356 A | 3/2003 |
| JP | 2003-100450 A | 4/2003 |
| JP | 2003-109756 A | 4/2003 |
| JP | 2003-223111 A | 8/2003 |
| JP | 2003-229250 A | 8/2003 |
| JP | 2004-004663 A | 1/2004 |
| JP | 2005-019082 A | 1/2005 |
| JP | 2005-150105 A | 6/2005 |
| JP | 2006-024530 A | 1/2006 |
| JP | 2006-040581 A | 2/2006 |
| KR | 2001-0078229 A | 8/2001 |

OTHER PUBLICATIONS

Written Opinion (Application No. PCT/JP2009/070789;PCT12079) Dated Jan. 19, 2010.

Korean Office Action (Application No. 2011-7016391) Dated Mar. 2, 2016.

* cited by examiner

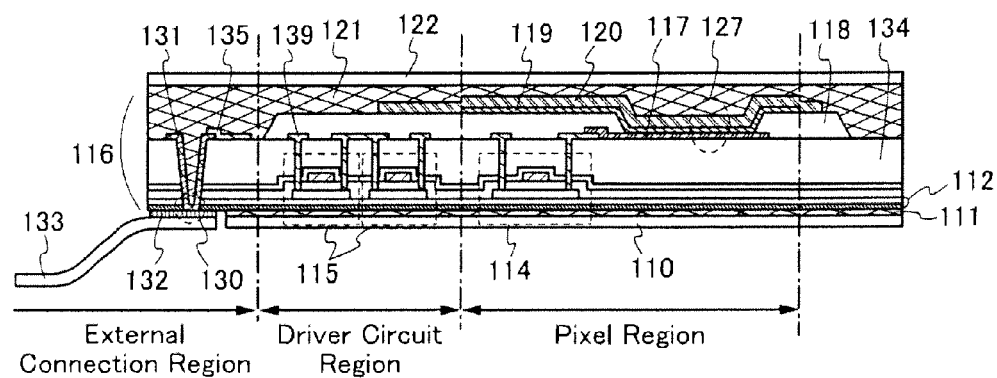

LIGHT-EMITTING DEVICE AND ELECTRONIC DEVICE

TECHNICAL FIELD

The present invention relates to a light-emitting device. Further, the present invention relates to an electronic device on which the light-emitting device is mounted.

BACKGROUND ART

In recent years, there has been significant technological progress in the field of displays. In particular, the needs of the market have stimulated tremendous progress in the technology directed to increasing resolution and thinning displays.

In the next phase of this field, focus is placed on commercialization of flexible displays having a curved display area, and a variety of proposals have been made to increase the flexibility of displays (for example, see Patent Document 1). In addition, light-emitting devices using a flexible substrate can be lightweight compared to those using a substrate of usual thickness which is formed of glass or the like.

As methods for manufacturing a light-emitting device using a flexible substrate, the following proposals have been made: a method in which a light-emitting element and other elements are directly provided over a flexible substrate; a method in which a light-emitting element is formed over a glass substrate of usual thickness and then the substrate is subjected to polishing treatment or the like, so that the substrate is thinned to have flexibility or the substrate is removed and the light-emitting element is attached to a flexible substrate; a method in which a light-emitting element and other elements are formed over a glass substrate of usual thickness and then a layer having the light-emitting element and the other elements is separated from the substrate and transferred to a flexible substrate; and the like.

Nevertheless, over a substrate having sufficient flexibility, a light-emitting element and other elements are not easy to form with high precision. Therefore, over such a substrate, it is difficult to form light-emitting elements for their respective colors or to provide a color filter, much less to form a semiconductor element. Further, a light-emitting device using a thinned glass substrate can be said to lack sufficient flexibility. Even if a light-emitting device is formed by removal of a glass substrate, such a light-emitting device has a problem of low productivity. In contrast, the method for manufacturing a light-emitting device in which a separation step and a transfer step are utilized is relatively simple and easy and facilitates fabrication of a semiconductor element or formation of light-emitting elements for their respective colors. This method can also ensure sufficient flexibility, which shows great promise.

REFERENCE

Patent Document

[Patent Document 1] Japanese Published Patent Application No. 2001-237064

DISCLOSURE OF INVENTION

Yet, it has been difficult to connect an external connection portion typified by an FPC (flexible printed circuit) to a light-emitting device to which the above manufacturing method is applied.

Therefore, an object of one embodiment of the invention is to provide a light-emitting device having a structure that facilitates provision of an external connection portion and a method for manufacturing the light-emitting device.

The above object can be achieved with a light-emitting device provided with an external connection terminal in a region where a through-hole penetrating an element formation layer is provided.

In other words, one embodiment of the present invention is a light-emitting device including a flexible lower support, a base insulating film being provided over the lower support and having a through-hole, a light-emitting element provided over the base insulating film, a flexible upper support provided over the light-emitting element, an electrode provided in the through-hole, an external connection terminal provided below the base insulating film and electrically connected to the electrode, and an external connection portion electrically connected to the external connection terminal.

Another embodiment of the present invention is a light-emitting device including a flexible lower support, a base insulating film being provided over the lower support and having a through-hole, a light-emitting element provided over the base insulating film, a flexible upper support provided over the light-emitting element, an external connection terminal provided in the through-hole, and an external connection portion provided below the base insulating film and electrically connected to the external connection terminal.

Still another embodiment of the present invention is a light-emitting device having any of the above structures in which the lower support and the external connection terminal are prevented from overlapping.

Yet another embodiment of the present invention is a light-emitting device having any of the above structures in which a protective member is provided below the lower support and the external connection portion.

A still further embodiment of the present invention is a light-emitting device having any of the above structures in which the lower support includes a notch portion in a region where the external connection terminal is formed.

Another embodiment of the present invention is a light-emitting device in which an opening portion is provided in a region where the external connection terminal is formed.

Still another embodiment of the present invention is a light-emitting device in which the distance between a side (third side) of the lower support which is close to the external connection terminal and a side (fourth side) of the lower support which is opposite to the side close to the external connection terminal is shorter than the distance between a side (first side) of the light-emitting device which is provided with the external connection terminal and a side (second side) of the light-emitting device which is opposite to the side provided with the external connection terminal.

Yet another embodiment of the present invention is a light-emitting device having any of these structures in which the lower support covers at least part of the external connection portion.

In a light-emitting device having any of these structures, an external connection portion can easily be provided.

BRIEF DESCRIPTION OF THE DRAWINGS

FIGS. 1A and 1B each illustrate a light-emitting device described in Embodiment 1.

BEST MODE FOR CARRYING OUT THE INVENTION

Figure 2A:
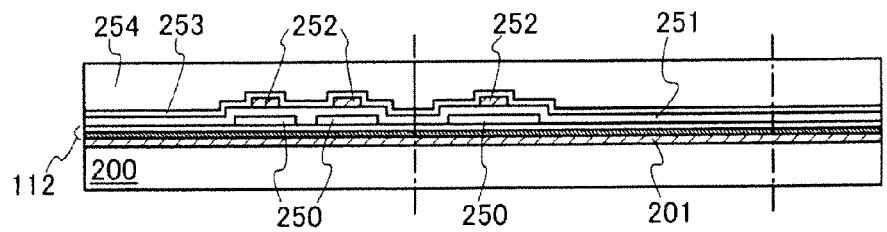
FIGS. 2A to 2E illustrate a manufacturing process of a light-emitting device described in Embodiment 1.
Figure 2B:
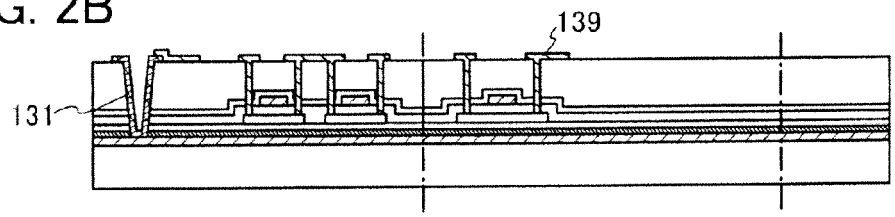

Hereinafter, embodiments of the present invention will be described with reference to the accompanying drawings. However, the present invention can be carried out in many different modes, and it is easily understood by those skilled in the art that modes and details thereof can be modified in various ways without departing from the spirit and the scope of the present invention. Therefore, the present invention should not be interpreted as being limited to the description of the embodiments.

(Embodiment 1)

A light-emitting device of this embodiment has an element formation layer including a light-emitting element, a thin film transistor (hereinafter, referred to as a TFT), and the like between a flexible upper support and a flexible lower support. The TFT is provided on the lower support side, and the light-emitting element is provided on the upper support side.

The above light-emitting device is formed in the following manner. The element formation layer including the TFT, the light-emitting element, and the like and the upper support are provided over a highly heat-resistant substrate, such as a glass substrate, with a separation layer interposed between the element formation layer and the substrate. After that, the element formation layer and the upper support are separated at the separation layer, and this separation step forms a separation surface, to which the lower support is then adhered. Note that the light-emitting device may alternatively be formed by, for example, a method in which, after the process up to the formation of the element formation layer, which is provided with a separation substrate, the element formation layer is separated by using this substrate prior to the provision of the upper support, and then the upper support is attached to or replaced with the separation substrate. Unlike a light-emitting device formed over a glass substrate, a light-emitting device formed as above has a structure in which the lower support is attached to the element formation layer later, and thus the connection terminal cannot be formed over the lower support beforehand. Therefore, the formation of a light-emitting device of this type requires complex and delicate work such as connecting an FPC before a separation step.

In the light-emitting device described in this embodiment, an external connection terminal is provided on the lower support side of the element formation layer. The external connection terminal is electrically connected to an electrode of the TFT or an electrode of the light-emitting element and supplies a signal generated in a power supply or outside with the light-emitting device via an external connection portion such as an FPC. Also via at least an electrode formed in a through-hole provided in the base insulating film, the external connection terminal is electrically connected to the electrode of the TFT or the electrode of the light-emitting element.

The through-hole may be formed by any method as long as it penetrates the base insulating film to expose a surface of the element formation layer. The through-hole is connected to the electrodes of the TFT and the light-emitting element through a contact hole, as appropriate.

Further, in the case where the external connection portion is connected to the external connection terminal after the lower support is adhered, the lower support is not provided in a region where the external connection terminal is provided, i.e., the lower support and the external connection terminal are prevented from overlapping. In other words, the lower support in this case has a notch or an opening portion in the region where the external connection terminal may be provided. Alternatively, the external connection terminal may be exposed by using a lower support the lateral length of which is shorter than that of the upper support by the lateral length of the external connection portion. In this case, in order to prevent damage to the external connection portion, a protective member is preferably provided to cover the external connection portion and the lower support. When the lower support is adhered after the external connection portion is connected to the external connection terminal, the lower support is provided to cover at least part of the external connection portion.

In the light-emitting device of this embodiment which has a structure described above, the external connection portion can be connected after the separation step. Thus, the light-emitting device of this embodiment enables the external connection portion to be easily provided.

FIGS. 1A and 1B each illustrate the light-emitting device of this embodiment.

FIG. 1A illustrates an example of the light-emitting device including a driver circuit region and a pixel region. Note that the driver circuit region and the pixel region each have a TFT. Over a lower support 110, a first adhesive layer 111 is provided. With the first adhesive layer 111, a base insulating film 112 and the lower support 110 are adhered to each other. Over the base insulating film 112, a pixel TFT 114, a TFT 115 for the driver circuit portion, and a first electrode 117 of a light-emitting element which is electrically connected to the pixel TFT 114 are provided. Note that the number of each of these components in the light-emitting device is more than one although not all of them are illustrated. A light-emitting element 127 includes the first electrode 117 exposed from the partition wall 118, an EL layer 119 containing an organic compound which is formed so as to cover at least the exposed first electrode 117, and a second electrode 120 which is provided to cover the EL layer 119. An upper support 122 is adhered on the second electrode 120 with a second adhesive layer 121. Further, in an external connection region, an external connection terminal 132 is provided below the base insulating film 112 and electrically connected to an electrode 131 formed in a through-hole 130. Moreover, an external connection portion 133 is connected to the external connection terminal 132. Note that the lower support 110 is not provided in a region where the external connection terminal 132 is provided. Further, the light-emitting device does not necessarily include the driver circuit region. Further, the light-emitting device may have a CPU portion. In addition, here, an element formation layer 116 includes a layer from the base insulating film 112 to the second electrode 120.

FIG. 1A illustrates the example in which the through-hole 130 penetrates from an interlayer insulating film 134 to the base insulating film 112. The electrode 131 provided in the through-hole 130 is connected to the electrode of the TFT or the electrode of the light-emitting element through a wiring such as a wiring 135 or a contact hole. Note that an electrode 139 of FIG. 1A is a wiring electrode connected to a source or drain region of the TFT.

FIG. 1B illustrates an example of a light-emitting device different from that of FIG. 1A. In FIG. 1B, the through-hole 130 penetrates a gate insulating film 136 and the base insulating film. In such a case, the electrode 131 provided in the through-hole 130 is connected to a wiring or an electrode provided on the interlayer insulating film 134, such as the electrode 139, through an electrode 137 formed in a contact hole 138.

Next, an example of a method for manufacturing the light-emitting device of this embodiment is described with reference to FIGS. 2A to 2E.

First, the base insulating film 112 is formed over a formation substrate 200 having an insulating surface with a separation layer 201 interposed therebetween. Over the base insulating film 112, a semiconductor layer 250, a gate insulating film 251, a gate electrode 252, a protective insulating film 253, and an interlayer insulating film 254 are further formed (see FIG. 2A).

The separation layer 201 is formed by a sputtering method, a plasma CVD method, a coating method, a printing method, or the like as a single layer or a stacked layer using an element such as tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), or silicon (Si); an alloy material containing the element as its main component; or a compound material containing the element as its main component. Note that in the case where the separation layer includes silicon, silicon may be any one of an amorphous state, a microcrystalline state, and a polycrystalline state. Here, the term coating method includes a spin-coating method, a droplet discharge method, a dispensing method, a nozzle-printing method, and a slot die coating method.

When the separation layer 201 has a single layer structure, it is preferable to form a tungsten layer, a molybdenum layer, or a layer containing a mixture of tungsten and molybdenum. Alternatively, a layer containing an oxide or an oxynitride of tungsten, a layer containing an oxide or an oxynitride of molybdenum, or a layer containing an oxide or an oxynitride of a mixture of tungsten and molybdenum is formed. Note that the mixture of tungsten and molybdenum corresponds to an alloy of tungsten and molybdenum, for example.

In the case where the separation layer 201 has a stack structure, it is preferable that a first layer be formed using a tungsten layer, a molybdenum layer, or a layer containing a mixture of tungsten and molybdenum and a second layer be formed using an oxide, a nitride, an oxynitride, or a nitride oxide of tungsten, molybdenum, or a mixture of tungsten and molybdenum.

In the case where the separation layer 201 has a stack structure of a layer containing tungsten and a layer containing an oxide of tungsten, the layer containing tungsten may be formed first and an insulating layer formed of an oxide may be formed over the layer containing tungsten so that the layer containing an oxide of tungsten can be formed at an interface between the tungsten layer and the insulating layer. Further, the surface of the layer containing tungsten may be subjected to thermal oxidation treatment, oxygen plasma treatment, or treatment using a strong oxidizing solution such as ozone water to form the layer containing an oxide of tungsten. Furthermore, plasma treatment or heat treatment may be performed in an atmosphere of an elementary substance of oxygen, nitrogen, dinitrogen monoxide, dinitrogen monoxide, or a mixed gas of any of these gases and another gas. Note that these methods can also be applied to formation of a stack structure of a layer including tungsten and a layer including nitride, oxynitride or nitride oxide of tungsten. Specifically, after the layer including tungsten is formed, the layer including silicon nitride, silicon oxynitride, or silicon nitride oxide of tungsten can be obtained by nitridation, oxynitridation, or nitridation oxidation or alternatively, by formation of a silicon nitride layer, a silicon oxynitride layer, or a silicon nitride oxide layer over the layer including tungsten.

Next, the base insulating film 112 is formed. The base insulating film 112 may have a single layer structure or a stack structure. When the base insulating film 112 has a stack structure, it preferably includes a film that is dense and has a high blocking property for inhibiting entry of a substance, such as moisture or metal, which promotes deterioration of the light-emitting element or TFT and a film for stabilizing properties of the TFT.

As the film having a high blocking property, there is an insulating film containing nitrogen and silicon, such as a film containing silicon nitride, silicon oxynitride, or silicon nitride oxide. The film having a high blocking property is formed by, for instance, a plasma CVD method under conditions where the temperature is set to 250 to 400° C. and the others are set as known.

The film for stabilizing properties of the TFT can be formed by using an inorganic insulating film of silicon oxide, silicon nitride, silicon oxynitride, silicon nitride oxide, or the like.

The semiconductor layer 250 serving as an active layer of the TFT can be formed using any of the following materials: an amorphous semiconductor formed by a vapor-phase growth method using a semiconductor source gas typified by silane or germane or a sputtering method; a polycrystalline semiconductor formed by crystallizing the amorphous semiconductor with the use of light energy or thermal energy; a microcrystalline (also referred to as semi-amorphous or microcrystal) semiconductor; a semiconductor containing an organic material as its main component; and the like. The semiconductor layer 250 can be formed by a sputtering method, an LPCVD method, a plasma CVD method, or the like.

The microcrystalline semiconductor belongs to an intermediate metastable state between an amorphous semiconductor and a single crystal semiconductor when Gibbs free energy is considered. In other words, the microcrystalline semiconductor layer is a semiconductor layer having a third state which is stable in terms of free energy and has a short range order and lattice distortion. Columnar-like or needle-like crystals grow in a normal direction with respect to a substrate surface. The Raman spectrum of microcrystalline silicon, which is a typical example of a microcrystalline semiconductor, is shifted to a wave number lower than 520 cm$^{-1}$, which represents a peak of the Raman spectrum of single crystal silicon. In other words, the peak of the Raman spectrum of the microcrystalline silicon exists between 520 cm$^{-1}$ which represents single crystal silicon and 480 cm$^{-1}$ which represents amorphous silicon. The microcrystalline silicon contains hydrogen or halogen of at least 1 at. % to terminate a dangling bond. Moreover, microcrystalline silicon is made to contain a rare gas element such as helium, argon, krypton, or neon to further enhance its lattice distortion, whereby stability is increased and a favorable microcrystalline semiconductor film can be obtained.

This microcrystalline semiconductor film can be formed by a high-frequency plasma CVD method with a frequency of several tens of MHz to several hundreds of MHz or with a microwave plasma CVD method with a frequency of greater than or equal to 1 GHz. The microcrystalline semiconductor film can be formed in such a manner that silicon hydride, typically, $SiH_4$, $Si_2H_6$, $SiH_2Cl_2$, $SiHCl_3$, $SiCl_4$, $SiF_4$, or the like is diluted with hydrogen. With a dilution with one or plural kinds of rare gas elements selected from helium, argon, krypton, and neon in addition to silicon hydride and hydrogen, the microcrystalline semiconductor film can be formed.

In that case, the flow ratio of hydrogen to silicon hydride is set to 5:1 to 200:1, preferably, 50:1 to 150:1, more preferably, 100:1.

As a typical example of an amorphous semiconductor, hydrogenated amorphous silicon can be given, and as an example of a crystalline semiconductor, polysilicon or the like can be given. Typical examples of polysilicon (polycrystalline silicon) include so-called high-temperature polysilicon that contains polysilicon which is formed at a process temperature of greater than or equal to 800° C. as its main component, so-called low-temperature polysilicon that contains polysilicon which is formed at a process temperature of less than or equal to 600° C. as its main component, polysilicon obtained by crystallizing amorphous silicon by using an element that promotes crystallization or the like, and the like. It is needless to say that as mentioned above, a microcrystalline semiconductor or a semiconductor containing a crystal phase in a part of a semiconductor layer can be used.

As a material of the semiconductor layer, as well as an element such as silicon (Si) or germanium (Ge), a compound semiconductor such as GaAs, InP, SiC, ZnSe, GaN, or SiGe can be used. Alternatively, an oxide semiconductor such as zinc oxide (ZnO), tin oxide ($SnO_2$), magnesium zinc oxide, gallium oxide, or indium oxide, an oxide semiconductor including two or more of the above oxide semiconductors, or the like can be used. For example, an oxide semiconductor including zinc oxide, indium oxide, and gallium oxide can also be used. In the case of using the oxide semiconductor for the semiconductor layer, the gate insulating film may be formed using $Y_2O_3$, $Al_2O_3$, or $TiO_2$, a stacked layer thereof, or the like, and the gate electrode layer, the source electrode layer, and the drain electrode layer may be formed using ITO, Au, Ti, or the like. In addition, In, Ga, or the like can be added to ZnO.

In the case of using a crystalline semiconductor layer for the semiconductor layer, the crystalline semiconductor layer may be formed by any of various methods (such as a laser crystallization method, a thermal crystallization method, and a thermal crystallization method using an element promoting crystallization, such as nickel). Also, a microcrystalline semiconductor can be crystallized by being irradiated with laser light to increase its crystallinity. When the element that promotes crystallization is not introduced, prior to irradiating an amorphous silicon film with laser light, the amorphous silicon film is heated at 500° C. for one hour under a nitrogen atmosphere to release hydrogen contained in the amorphous silicon film so that the concentration of hydrogen is reduced to $1 \times 10^{20}$ atoms/cm$^3$ or lower. This is because the amorphous silicon film is destroyed when the amorphous silicon film containing a high amount of hydrogen is irradiated with laser light.

A method for introducing a metal element into an amorphous semiconductor layer is not limited to a particular method as long as it is a method capable of providing the metal element on a surface or inside of the amorphous semiconductor layer. For example, a sputtering method, a CVD method, a plasma processing method (including a plasma CVD method), an adsorption method, or a method for applying a solution of metal salt, can be used. In the above mentioned methods, the method using a solution is simple and has an advantage that the concentration of a metal element can easily be adjusted. In addition, at this time, in order to improve the wettability of the surface of the amorphous semiconductor layer to spread an aqueous solution on the entire surface of the amorphous semiconductor layer, an oxide film is preferably formed by UV light irradiation in an oxygen atmosphere, a thermal oxidation method, treatment using ozone water containing hydroxy radical or a hydrogen peroxide solution, or the like.

In addition, in a crystallization step in which the amorphous semiconductor layer is crystallized to form a crystalline semiconductor layer, the crystallization may be performed by adding an element that promotes crystallization (also referred to as a catalyst element or a metal element) to the amorphous semiconductor layer and performing heat treatment (at 550 to 750° C. for 3 minutes to 24 hours). As the element that promotes (accelerates) the crystallization, one or more of iron (Fe), nickel (Ni), cobalt (Co), ruthenium (Ru), rhodium (Rh), palladium (Pd), osmium (Os), iridium (Ir), platinum (Pt), copper (Cu), and gold (Au) can be used.

In order to remove or reduce the element which promotes crystallization from the crystalline semiconductor layer, a semiconductor layer containing an impurity element is formed in contact with the crystalline semiconductor layer and is made to function as a gettering sink. As the impurity element, an impurity element imparting n-type conductivity, an impurity element imparting p-type conductivity, a rare gas element, or the like can be used. For example, one or more of phosphorus (P), nitrogen (N), arsenic (As), antimony (Sb), bismuth (Bi), boron (B), helium (He), neon (Ne), argon (Ar), krypton (Kr), and xenon (Xe) can be used. The semiconductor layer containing a rare gas element is formed over the crystalline semiconductor layer containing an element which promotes crystallization, and heat treatment (at 550 to 750° C. for 3 minutes to 24 hours) is performed. The element that promotes crystallization in the crystalline semiconductor layer moves into the semiconductor layer containing a rare gas element, and the element that promotes crystallization in the crystalline semiconductor layer is removed or reduced. Then, the semiconductor layer containing a rare gas element, which serves as a gettering sink, is removed.

The amorphous semiconductor layer may be crystallized by using combination of heat treatment and laser light irradiation. The heat treatment or the laser light irradiation may be carried out several times, separately.

Alternatively, the crystalline semiconductor layer may be directly formed over the substrate by a plasma method. Alternatively, the crystalline semiconductor layer may be selectively formed over the substrate by a plasma method.

As the semiconductor film containing an organic material as its main component, a semiconductor film containing, as its main component, a substance which contains a certain amount of carbon or an allotrope of carbon (excluding diamond), which is combined with another element, can be used. Specifically, pentacene, tetracene, a thiophene oligomer derivative, a phenylene derivative, a phthalocyanine compound, a polyacetylene derivative, a polythiophene derivative, a cyanine dye, and the like can be given.

The gate insulating film 251 and the gate electrode 252 may be formed to have a known structure by a known method. For example, the gate insulating film 251 may be formed to have a known structure such as a single layer structure of silicon oxide or a stack structure including silicon oxide and silicon nitride, and the gate electrode 252 may be formed using any of Ag, Au, Cu, Ni, Pt, Pd, Ir, Rh, W, Al, Ta, Mo, Cd, Zn, Fe, Ti, Si, Ge, Zr, and Ba; or an alloy material or a compound material containing any of the elements as its main component by a CVD method, a sputtering method, a droplet discharge method, or the like. In addition, a semiconductor film typified by a polycrystalline silicon film doped with an impurity element such as phosphorus, or an AgPdCu alloy may be used. Further, either a single layer structure or a stack structure may be employed.

Note that the top gate transistor illustrated as an example may naturally be replaced with a bottom gate transistor or a transistor having any other known structure.

Next, the protective insulating film 253 including an inorganic insulating material and then the interlayer insulating film 254 including an organic or inorganic insulating material are formed. As the inorganic insulating material, silicon oxide, silicon nitride, silicon oxynitride, silicon nitride oxide, or the like can be used. As the organic insulating material, acrylic, polyimide, polyamide, polyimideamide, benzocyclobutene, or the like can be used After the interlayer insulating film 254 is formed, by patterning and etching, contact holes reaching the semiconductor layer 250 of the TFT are formed in the interlayer insulating film 254, the protective insulating film 253, and the gate insulating film 251, and the through-hole is formed in the interlayer insulating film 254, the protective insulating film 253, the gate insulating film 251, and the base insulating film 112. The through-hole is formed by continuing the etching even after the contact holes reach the semiconductor layer 250. As the etching at this time, a method and conditions are selected such that the selection ratio of the interlayer insulating film 254, the protective insulating film 253, the gate insulating film 251, and the base insulating film 112 to the semiconductor layer 250 is sufficiently high.

After that, the electrode 131 is formed in the through-hole while the wiring electrode such as the electrode 139 is formed in the contact holes. The electrode 131 and the electrode 139 may be formed in the same step or using different materials in different steps.

Alternatively, the through-hole and the contact holes may be formed in different steps. In this case, the formation of the through-hole and oxidation treatment by O2 ashing or the like on the exposed surface of the separation layer 201 can precede the formation of the electrode 131. Accordingly, adhesion between the electrode 131 and the separation layer 201 can be reduced to facilitate the separation in a later separation step (see FIG. 2B).

Then, the first electrode 117 is formed using a transparent conductive film. When the first electrode 117 is an anode, indium oxide ($In_2O_3$), an alloy of indium oxide and tin oxide ($In_2O_3$—$SnO_2$:ITO), or the like can be used as a material of the transparent conductive film, and the first electrode 117 can be formed by a sputtering method, a vacuum evaporation method, or the like. Alternatively, an alloy of indium oxide and zinc oxide ($In_2O_3$—ZnO) may be used. In addition, zinc oxide (ZnO) is also an appropriate material, and moreover, zinc oxide to which gallium (Ga) is added to increase conductivity and a light-transmitting property with respect to visible light, or the like can be used. When the first electrode 117 is a cathode, an extremely thin film of a material with a low work function such as aluminum can be used. Alternatively, a stack structure which has a thin layer of such a substance and the above-mentioned transparent conductive film can be employed.

Then, the insulating film 254 is formed using an organic or inorganic insulating material so as to cover the interlayer insulating film and the first electrode 117. The insulating film is processed such that the surface of the first electrode 117 is exposed and the insulating film covers an end portion of the first electrode 117, whereby the partition wall 118 is formed.

Then, the EL layer 119 is formed. There is no particular limitation on a stack structure of the EL layer 119 as long as it is formed by combining layers including a substance having a high electron-transport property, a substance having a high hole-transport property, a substance having a high electron-injection property, a substance having a high hole-injection property, a bipolar substance (a substance having a high electron-transport property and a high hole-transport property), a light-emitting substance, and/or the like, as appropriate. For example, an appropriate combination of any of a hole-injection layer, a hole-transport layer, a light-emitting layer, an electron-transport layer, an electron-injection layer, and the like can be formed. In this embodiment, a structure is explained in which the EL layer 119 includes a hole-injection layer, a hole-transport layer, a light-emitting layer, and an electron-transport layer. Specific materials to form each of the layers are given below.

The hole-injection layer is a layer that is provided in contact with an anode and contains a substance having a high hole-injection property. Specifically, molybdenum oxide, vanadium oxide, ruthenium oxide, tungsten oxide, manganese oxide, or the like can be used. Alternatively, the hole-injection layer can also be formed using any of the following materials: phthalocyanine compounds such as phthalocyanine (abbreviated to $H_2PC$) and copper phthalocyanine (abbreviated to CuPc); aromatic amine compounds such as 4,4'-bis[N-(4-diphenylaminophenyl)-N-phenylamino]biphenyl (abbreviated to DPAB) and 4,4'-bis(N-{4-[N-(3-methylphenyl)-N-phenylamino]phenyl}-N'-phenylamino)biphenyl (abbreviated to DNTPD); high-molecular compounds such as polyethylenedioxythiophene/polystyrenesulfonic acid (abbreviated to PEDOT/PSS), and the like.

Alternatively, as the hole-injection layer, a composite material containing a substance having a high hole-transport property and an acceptor substance can be used. Note that, by using the composite material containing the substance having a high hole-transport property and the acceptor substance, a material used to form an electrode can be selected regardless of its work function. In other words, besides a material with a high work function, a material with a low work function can also be used as the first electrode 117. As the acceptor substance, 7,7,8,8-tetracyano-2,3,5,6-tetrafluoroquinodimethane (abbreviated to $F_4$-TCNQ), chloranil, and the like can be given. In addition, as the acceptor substance, a transition metal oxide is given. In addition, oxides of metals that belong to Group 4 to Group 8 of the periodic table are given. Specifically, vanadium oxide, niobium oxide, tantalum oxide, chromium oxide, molybdenum oxide, tungsten oxide, manganese oxide, and rhenium oxide are preferable because of their high electron-accepting properties. Among these metal oxides, molybdenum oxide is preferable since it can be easily treated due to its stability in air and low hygroscopic property.

As the substance having a high hole-transport property used for the composite material, any of various compounds such as aromatic amine compounds, carbazole derivatives, aromatic hydrocarbons, or high-molecular compounds (such as oligomers, dendrimers, or polymers) can be used. Note that the organic compound used for the composite material is preferably an organic compound having a high hole-transport property. Specifically, a substance having a hole mobility of greater than or equal to $10^{-6}$ cm$^2$/Vs is preferably used. However, other substances than these substances may also be used as long as the hole-transport property thereof is higher than the electron-transport property thereof. The organic compound that can be used for the composite material is specifically shown below.

Examples of the aromatic amine compounds include N,N'-di(p-tolyl)-N,N'-diphenyl-p-phenylenediamine (abbreviated to DTDPPA), 4,4'-bis[N-(4-diphenylaminophenyl)-N-phenylamino]biphenyl (abbreviated to DPAB), 4,4'-bis(N-{4-[N'(3-methylphenyl)-N-phenylamino]phenyl}-N'-phenylamino)biphenyl (abbreviated to DNTPD), 1,3,5-tris[N-(4-diphenylaminophenyl)-N-phenylamino]benzene (abbreviated to DPA3B), and the like.

Examples of the carbazole derivatives which can be used for the composite material include 3-[N-(9-phenylcarbazol-3-yl)-N-phenylamino]-9-phenylcarbazole (abbreviated to PCzPCA1), 3,6-bis[N-(9-phenylcarbazol-3-yl)-N-phenylamino]-9-phenylcarbazole (abbreviated to PCzPCA2), 3-[N-(1-naphtyl)-N-(9-phenylcarbazol-3-yl)amino]-9-phenylcarbazole (abbreviated to PCzPCN1), and the like.

In addition, examples of the carbazole derivatives which can be used for the composite material include 4,4'-di(N-carbazolyl)biphenyl (abbreviated to CBP), 1,3,5-tris[4-(N-carbazolyl)phenyl]benzene (abbreviated to TCPB), 9-[4-(10-phenyl-9-anthryl)phenyl]-9H-carbazole (abbreviated to CzPA), 1,4-bis[4-(N-carbazolyl)phenyl]-2,3,5,6-tetraphenylbenzene, and the like.

Examples of the aromatic hydrocarbons which can be used for the composite material include 2-tert-butyl-9,10-di(2-naphthyl)anthracene (abbreviated to t-BuDNA), 2-tert-butyl-9,10-di(1-naphthyl)anthracene, 9,10-bis(3,5-diphenylphenyl)anthracene (abbreviated to DPPA), 2-tert-butyl-9,10-bis(4-phenylphenyl)anthracene (abbreviated to t-BuDBA), 9,10-di(2-naphthyl)anthracene (abbreviated to DNA), 9,10-diphenylanthracene (abbreviated to DPAnth), 2-tert-butylanthracene (abbreviated to t-BuAnth), 9,10-bis(4-methyl-1-naphthyl)anthracene (abbreviated to DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. As well as these compounds, pentacene, coronene, or the like can be used. Note that when an aromatic hydrocarbon having a hole mobility of greater than or equal to $1\times10^{-6}$ cm$^2$/Vs is selected and an evaporation method is used to form a film of the aromatic hydrocarbon, the number of the carbon atoms that forms a condensed ring is preferably 14 to 42 in terms of evaporativity at the time of evaporation or film quality after the film formation.

Note that the aromatic hydrocarbon that can be used for the composite material may have a vinyl skeleton. As an aromatic hydrocarbon having a vinyl group, for example, 4,4'-bis(2,2-diphenylvinyl)biphenyl (abbreviated to DPVBi), 9,10-bis[4-(2,2-diphenylvinyl)phenyl]anthracene (abbreviated to DPVPA), and the like are given.

High-molecular compounds such as poly(N-vinylcarbazole) (abbreviated to PVK), poly(4-vinyltriphenylamine) (abbreviated to PVTPA), poly[N-(4-{N'-[4-(4-diphenylamino)phenyl]phenyl-N'-phenylamino}phenyl)methacrylamide] (abbreviated to PTPDMA), poly[N,N'-bis(4-butylphenyl)-N,N'-bis(phenyl)benzidine](abbreviated to Poly-TPD), and the like can also be used.

The hole-transport layer is a layer that contains a substance having a high hole-transport property. Examples of the substance having a high hole-transport property include aromatic amine compounds such as 4,4'-bis[N-(1-naphthyl)-N-phenylamino]biphenyl (abbreviated to NPB), N,N'-bis(3-methylphenyl)-N,N'-diphenyl-[1,1'-biphenyl]-4,4'-diamine (abbreviated to TPD), 4,4',4''-tris(N,N-diphenylamino)triphenylamine (abbreviated to TDATA), 4,4',4''-tris[N-(3-methylphenyl)-N-phenylamino]triphenylamine (abbreviated to MTDATA), 4,4'-bis[N-(spiro-9,9'-bifluoren-2-yl)-N-phenylamino]biphenyl (abbreviated to BSPB), and the like. The substances described here are mainly substances having a hole mobility of greater than or equal to $10^{-6}$ cm$^2$/Vs. However, a substance other than the above-described substances may also be used as long as the hole-transport property thereof is higher than the electron-transport property thereof. Note that the layer containing the substance having a high hole-transport property is not limited to a single layer, and two or more layers containing the aforementioned substances may be stacked.

Further, a high-molecular compound such as poly(N-vinylcarbazole) (abbreviated to PVK) or poly(4-vinyltriphenylamine) (abbreviated to PVTPA) can also be used for the hole-transport layer.

The light-emitting layer is a layer containing a light-emitting substance. The light-emitting layer may be a so-called single light-emitting layer containing a light-emitting substance as its main component or a so-called host-guest type light-emitting layer in which a light-emitting substance is dispersed in a host material.

There is no particular limitation on the light-emitting substance that is used, and known fluorescent materials or phosphorescent materials can be used. As fluorescent materials, for example, in addition to N,N'-bis[4-(9H-carbazol-9-yl)phenyl]-N,N'-diphenylstilbene-4,4'-diamine (abbreviated to YGA2S), 4-(9H-carbazol-9-yl)-4'-(10-phenyl-9-anthryl)triphenylamine (abbreviated to YGAPA), and the like, there are fluorescent materials with an emission wavelength of greater than or equal to 450 nm, such as 4-(9H-carbazol-9-yl)-4'-(9,10-diphenyl-2-anthryl)triphenylamine (abbreviated to 2YGAPPA), N,9-diphenyl-N-[4-(10-phenyl-9-anthryl)phenyl]-9H-carbazol-3-amine (abbreviated to PCAPA), perylene, 2,5,8,11-tetra-tert-butylperylene (abbreviated to TBP), 4-(10-phenyl-9-anthryl)-4'-(9-phenyl]-9H-carbazol-3-yl)triphenylamine (abbreviated to PCBAPA), N,N'''-(2-tert-butylanthracene-9,10-diyldi-4,1-phenylene)bis[N,N',N'-triphenyl-1,4-phenylenediamine] (abbreviated to DPABPA), N,9-diphenyl-N-[4-(9,10-diphenyl-2-anthryl)phenyl]-9H-carbazol-3-amine (abbreviated to 2PCAPPA), N'''-[4-(9,10-diphenyl-2-anthryl)phenyl]-N,N',N'-triphenyl-1,4-phenylenediamine (abbreviated to 2DPAPPA). N,N,N',N',N'',N'',N''',N'''-octaphenyldibenzo[g,p]chrysene-2,7,10,15-tetraamine (abbreviated to DBC1), coumarin 30. N-(9,10-diphenyl-2-anthryl)-N,9-diphenyl-9H-carbazol-3-amine (abbreviated to 2PCAPA), N-[9,10-bis(1,1'-biphenyl-2-yl)-2-anthryl]-N,9-diphenyl-9H-carbazol-3-amine (abbreviated to 2PCABPhA), N-(9,10-diphenyl-2-anthryl)-N,N',N'-triphenyl-1,4-phenylenediamine (abbreviated to 2DPAPA), N-[9,10-bis(1,1'-biphenyl-2-yl)-2-anthryl]-N,N',N'-triphenyl-1,4-phenylenediamine (abbreviated to 2DPABPhA), 9,10-bis(1,1'-biphenyl-2-yl)-N-[4-(9H-carbazol-9-yl)phenyl]-N-phenylanthracen-2-amine (abbreviated to 2YGABPhA), N,N,9-triphenylanthracen-9-amine (abbreviated to DPhAPhA), coumarin 545T, N,N'-diphenylquinacridone (abbreviated to DPQd), rubrene, 5,12-bis(1,1'-biphenyl-4-yl)-6,11-diphenyltetracene (abbreviated to BPT), 2-(2-{2-[4-(dimethylamino)phenyl]ethenyl}-6-methyl-4H-pyran-4-ylidene)propanedinitrile (abbreviated to DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviated to DCM2). N,N,N',N'-tetrakis(4-methylphenyl)tetracene-5,11-diamine (abbreviated to p-mPhTD), 7,14-diphenyl-N,N,N',N'-tetrakis(4-methylphenyl)acenaphtho[1,2-a]fluoranthene-3,10-diamine (abbreviated to p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviated to DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviated to DCJTB), 2-(2,6-bis{2-[4-(dimethylamino)phenyl]ethenyl}-4H-pyran-4-ylidene)propanedinitrile (abbreviated to BisDCM), and 2-{2, 6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviated to BisDCJTM). As phosphorescent materials, for example, in addition to bis[2-(4',6'-difluorophenyl)pyridinato-N,$C^{2'}$]iridium(III)tetrakis(1-pyrazolyl)borate (abbreviated to FIr6) and the like, there are phosphorescent materials with an emission wavelength in the range of 470 nm to 500 nm, such as bis[2-(4',6'-difluorophenyl)pyridinato-N,$C^{2'}$]iridium(III)picolinate (abbreviated to FIrpic), bis[2-(3',5'-bistrifluoromethylphenyl)pyridinato-N,$C^{2'}$]iridium(III)picolinate (abbreviated to Ir($CF_3$ ppy)$_2$(pic)), and bis[2-(4',6'-difluorophenyl)pyridinato-N,$C^{2'}$]iridium(III)acetylacetonate (abbreviated to FIracac); phosphorescent materials with an emission wavelength of greater than or equal to 500 nm (materials which emit green light), such as tris(2-phenylpyridinato)iridium(III) (abbreviated to Ir(ppy)$_3$), bis(2-phenylpyridinato)iridium(II)acetylacetonate (abbreviated to Ir(ppy)$_2$(acac)), tris(acetylacetonato)(monophenanthroline)terbium(III) (abbreviated to Tb(acac)$_3$(Phen)), bis(benzo[h]quinolinato)iridium(III)acetylacetonate (abbreviated to Ir(bzq)$_2$(acac)), bis(2,4-diphenyl-1,3-oxazolato-N,$C^{2'}$)iridium(III)acetylacetonate (abbreviated to Ir(dpo)$_2$(acac)), bis[2-(4'-perfluorophenylphenyl)pyridinato]iridium(II)acetylacetonate (abbreviated to Ir(p-PF-ph)$_2$(acac)), bis(2-phenylbenzothiazolato-N,$C^{2'}$)iridium(III)acetylacetonate (abbreviated to Ir(bt)$_2$(acac)), bis[2-(2'-benzo[4,5-a]thienyl)pyridinato-N,$C^{3'}$]iridium(III)acetylacetonate (abbreviated to Ir(btp)$_2$(acac)), bis(1-phenylisoquinolinato-N,$C^{2'}$)iridium(III)acetylacetonate (abbreviated to Ir(piq)$_2$(acac)), (acetylacetonato)bis[2,3-bis(4-fluorophenyl)quinoxalinato]iridium(III) (abbreviated to Ir(Fdpq)$_2$(acac)), (acetylacetonato)bis(2,3,5-triphenylpyrazinato)iridium(III) (abbreviated to Ir(tppr)$_2$(acac)), 2,3,7,8,12,13,17,18-octaethyl-21H,23H-porphyrinatoplatinum(II) (abbreviated to PtOEP), tris(1,3-diphenyl-1,3-propanedionato)(monophenanthroline)europium(II) (abbreviated to Eu(DBM)$_3$(Phen)), and tris[1-(2-thenoyl)-3,3,3-trifluoroacetonato](monophenanthroline)europium(III) (abbreviated to Eu(TTA)$_3$(Phen)); and the like. The light-emitting substances can be selected from the above-mentioned materials or other known materials in consideration of the emission color of each of the light-emitting elements.

When the host material is used, there are, for example, metal complexes such as tris(8-quinolinolato)aluminum(III) (abbreviated to Alq), tris(4-methyl-8-quinolinolato)aluminum(III) (abbreviated to Almq$_3$), bis(10-hydroxybenzo[h]quinolinato)beryllium(II) (abbreviated to BeBq$_2$), bis(2-methyl-8-quinolinolato)(4-phenylphenolato)aluminum(III) (abbreviated to BAlq), bis(8-quinolinolato)zinc(II) (abbreviated to Znq), bis[2-(2-benzoxazolyl)phenolato]zinc(II) (abbreviated to ZnPBO), and bis[2-(2-benzothiazolyl)phenolato]zinc(II) (abbreviated to ZnBTZ); heterocyclic compounds such as 2-(4-biphenylyl)-5-(4-tert-butylphenyl)-1,3,4-oxadiazole (abbreviated to PBD), 1,3-bis[5-(p-tert-butylphenyl)-1,3,4-oxadiazol-2-yl]benzene (abbreviated to OXD-7), 3-(4-biphenylyl)-4-phenyl-5-(4-tert-butylphenyl)-1,2,4-triazole (abbreviated to TAZ), 2,2',2"-(1,3,5-benzenetriyl)-tris(1-phenyl-1H-benzimidazole) (abbreviated to TPBI), bathophenanthroline (abbreviated to BPhen), bathocuproine (abbreviated to BCP), and 9-[4-(5-phenyl-1,3,4-oxadiazol-2-yl)phenyl]-9H-carbazole (abbreviated to CO11); and aromatic amine compounds such as NPB (or α-NPD), TPD, and BSPB. In addition, condensed polycyclic aromatic compounds such as anthracene derivatives, phenanthrene derivatives, pyrene derivatives, chrysene derivatives, and dibenzo[g,p]chrysene derivatives are given. Specific examples of the condensed polycyclic aromatic compounds include 9,10-diphenylanthracene (abbreviated to DPAnth), N,N-diphenyl-9-[4-(10-phenyl-9-anthryl)phenyl]-9H-carbazol-3-amine (abbreviated to CzA1PA), 4-(10-phenyl-9-anthryl)triphenylamine (abbreviated to DPhPA), 4-(9H-carbazol-9-yl)-4'-(10-phenyl-9-anthryl)triphenylamine (abbreviated to YGAPA), N,9-diphenyl-N-[4-(10-phenyl-9-anthryl)phenyl]-9H-carbazol-3-amine (abbreviated to PCAPA), N,9-diphenyl-N-(4-[4-(10-phenyl-9-anthryl)phenyl]phenyl)-9H-carbazol-3-amine (abbreviated to PCAPBA), N-9-diphenyl-N-(9,10-diphenyl-2-anthryl)-9H-carbazol-3-amine (abbreviated to 2PCAPA), 6,12-dimethoxy-5,11-diphenylchrysene, N,N,N',N',N",N",N"',N"'-octaphenyldibenzo[g,p]chrysene-2,7,10,15-tetramine (abbreviated to DBC1), 9-[4-(10-phenyl-9-anthryl)phenyl]-9H-carbazole (abbreviated to CzPA), 3,6-diphenyl-9-[4-(10-phenyl-9-antryl)phenyl]-9H-carbazole (abbreviated to DPCzPA), 9,10-bis(3,5-diphenylphenyl)anthracene (abbreviated to DPPA), 9,10-di(2-naphthyl)anthracene (abbreviated to DNA), 2-tert-butyl-9,10-di(2-naphthyl)anthracene (abbreviated to t-BuDNA), 9,9'-bianthryl (abbreviated to BANT), 9,9'-(stilbene-3,3'-diyl)diphenanthrene (abbreviated to DPNS), 9,9'-(stilbene-4,4'-diyl)diphenanthrene (abbreviated to DPNS2), 3,3',3"-(benzene-1,3,5-triyl)tripyrene (abbreviated to TPB3), and the like. From these substances or other known substances, the host material may be selected so that the host material has a larger energy gap (or triplet excitation energy if the light-emitting substance emits phosphorescence) than the light-emitting substance dispersed in the light-emitting layer and has a carrier-transport property required for each of the light-emitting layers.

The electron-transport layer is a layer that contains a substance having a high electron-transport property. For example, a layer containing a metal complex having a quinoline skeleton or a benzoquinoline skeleton, such as tris(8-quinolinolato)aluminum (abbreviated to Alq), tris(4-methyl-8-quinolinolato)aluminum (abbreviated to Almq$_3$), bis(10-hydroxybenzo[h]-quinolinato)beryllium (abbreviated to BeBq$_2$), or bis(2-methyl-8-quinolinolato)(4-phenylphenolato)aluminum (abbreviated to BAlq) can be used. Alternatively, a metal complex having an oxazole-based or thiazole-based ligand, such as bis[2-(2-hydroxyphenyl)benzoxazolato]zinc (abbreviated to Zn(BOX)$_2$) or bis[2-(2-hydroxyphenyl)benzothiazolato]zinc (abbreviated to Zn(BTZ)$_2$) can be used. Besides the metal complexes, 2-(4-biphenylyl)-5-(4-tert-butylphenyl)-1,3,4-oxadiazole (abbreviated to PBD), 1,3-bis[5-(p-tert-butylphenyl)-1,3,4-oxadiazol-2-yl]benzene (abbreviated to OXD-7), 3-(4-biphenylyl)-4-phenyl-5-(4-tert-butylphenyl)-1,2,4-triazole (abbreviated to TAZ), bathophenanthroline (abbreviated to BPhen), bathocuproine (abbreviated to BCP), or the like can also be used. The substances described here are mainly those having an electron mobility of greater than or equal to $10^{-6}$ cm$^2$/Vs. Note that a substance other than the above substances may also be used as the electron-transport layer as long as the electron-transport property thereof is higher than the hole-transport property thereof.

Further, the electron-transport layer may be formed as not only a single layer but also as a stacked layer in which two or more layers formed using the above mentioned substances are stacked.

Further, a layer for controlling transport of electrons may be provided between the electron-transport layer and the light-emitting layer. The layer for controlling transport of electrons is a layer in which a small amount of a substance having a high electron-trapping property is added to a layer containing the above-mentioned substances having a high electron-transport property. The layer for controlling transport of electrons controls transport of electrons, which enables adjustment of carrier balance. Such a structure is very effective in suppressing a problem (such as shortening of element lifetime) caused by a phenomenon in which an electron passes through the light-emitting layer.

Further, an electron-injection layer may be provided so as to be in contact with the electrode functioning as a cathode. As the electron-injection layer, an alkali metal, an alkaline earth metal, or a compound thereof, such as lithium fluoride (LiF), cesium fluoride (CsF), calcium fluoride ($CaF_2$), or the like can be employed. For example, a layer which contains both a substance having an electron-transport property and an alkali metal, an alkaline earth metal, or a compound thereof, e.g., a layer of Alq which contains magnesium (Mg), can be used. Note that a layer including an electron-transport substance which includes an alkali metal or an alkaline earth metal is more preferably used for the electron-injection layer, in which case electron injection from the second electrode 120 proceeds efficiently.

When the second electrode 120 is used as a cathode, a metal, an alloy, an electrically conductive compound, a mixture thereof, or the like having a low work function (specifically, a work function of 3.8 eV or lower), can be used as a substance for the second electrode 120. As a specific example of such a cathode material, an element belonging to Group 1 or Group 2 of the periodic table, i.e., an alkali metal such as lithium (Li) or cesium (Cs), an alkaline earth metal such as magnesium (Mg), calcium (Ca), or strontium (Sr), an alloy containing any of these metals (such as MgAg or AlLi), a rare earth metal such as europium (Eu) or ytterbium (Yb), an alloy containing such a rare earth metal, or the like can be used. However, when the electron-injection layer is provided between the cathode and the electron-transport layer, any of a variety of conductive materials such as Al, Ag, ITO, indium oxide-tin oxide containing silicon or silicon oxide, and the like can be used regardless of its work function as the cathode. Films of these conductive materials can be formed by a sputtering method, an inkjet method, a spin coating method, or the like.

It is preferable that, when the second electrode 120 is used as an anode, the second electrode 120 be formed using a metal, an alloy, a conductive compound, a mixture thereof, or the like having a high work function (specifically, a work function of 4.0 eV or higher). Specifically, indium oxide-tin oxide (ITO: indium tin oxide), indium oxide-tin oxide containing silicon or silicon oxide, indium oxide-zinc oxide (IZO: indium zinc oxide), indium oxide containing tungsten oxide and zinc oxide (IWZO), or the like can be used. These conductive metal oxide films are generally formed by a sputtering method; however, the films may be formed by applying a sol-gel method. For example, a film of indium oxide-zinc oxide (IZO) can be formed by a sputtering method using indium oxide, to which zinc oxide is added at 1 to 20 wt %, as a target. A film of indium oxide containing tungsten oxide and zinc oxide (IWZO) can be formed by a sputtering method using a target in which tungsten oxide and zinc oxide are mixed at 0.5 to 5 wt % and 0.1 to 1 wt %, respectively, with indium oxide. In addition, gold (Au), platinum (Pt), nickel (Ni), tungsten (W), chromium (Cr), molybdenum (Mo), iron (Fe), cobalt (Co), copper (Cu), palladium (Pd), a nitride of a metal (such as titanium nitride), and the like are given. By forming the above-mentioned composite material so as to be in contact with the anode, a material for the electrode can be selected regardless of its work function.

Figure 2C:
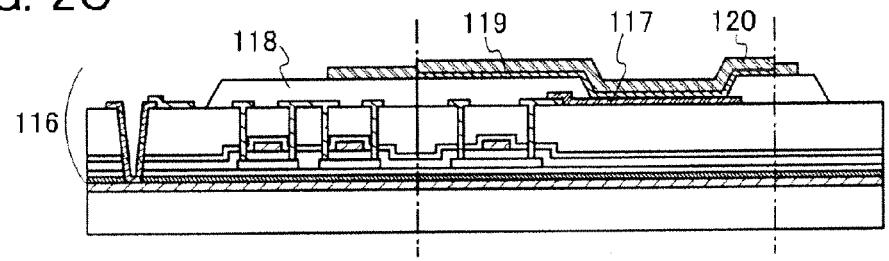

The element formation layer 116 can be formed through the above steps (see FIG. 2C).

Next, the element formation layer 116 is adhered to the upper support 122 with the second adhesive layer 121, and then, at the separation layer 201, separated from the formation substrate 200. Accordingly, the element formation layer 116 is supported by the flexible upper support 122, and the electrode 131 provided in the through-hole is exposed on the surface of the element formation layer 116 which is opposite to the upper support 122 (see FIG. 2D).

As a material for the second adhesive layer 121, any of a variety of curable adhesives, such as a reactive curable adhesive, a thermal curable adhesive, a photo curable adhesive such as an ultraviolet curable adhesive, or an anaerobic adhesive can be used.

As the upper support 122, a flexible film or substrate formed of any of the following materials can be used: an acrylic resin, a polyester resin such as polyethylene terephthalate (PET) or polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinylchloride resin, metal, and the like.

Over the upper support 122, a protective layer having low permeability may be formed in advance, and examples thereof include a film containing nitrogen and silicon such as a film containing silicon nitride or silicon oxynitride, a film containing nitrogen and aluminum such as a film containing aluminum nitride, and the like.

Figure 2D:
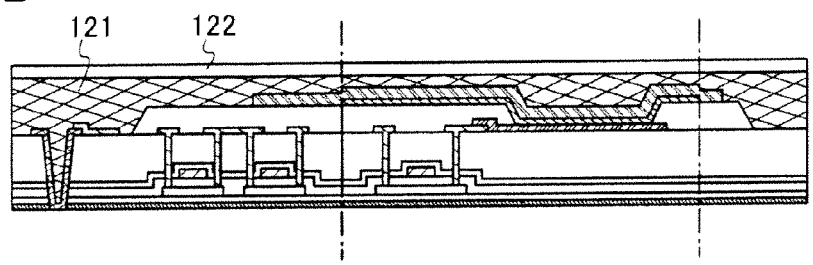
Figure 2E:
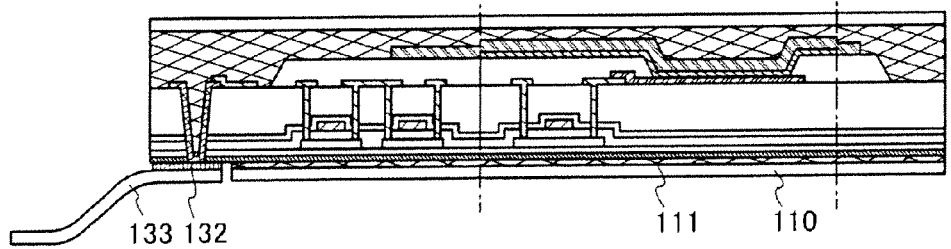

Further, the step of FIG. 2D may be as follows: a separation support is used in place of the upper support 122 to perform separation, and the upper support is adhered with an adhesive agent; or alternatively, a separation support is used to perform separation and then removed, and the upper support is adhered with an adhesive agent.

Note that the following methods can be applied to the separation step, as appropriate: a method in which a separation layer is formed between a formation substrate and a layer that is to be separated, a metal oxide film is provided between the separation layer and the layer that is to be separated, and the metal oxide film is weakened by crystallization to carry out separation of the layer that is to be separated and provided over the metal oxide film; a method in which an amorphous silicon film containing hydrogen is provided between a highly heat-resistant formation substrate and a layer that is to be separated, and the amorphous silicon film is removed by laser beam irradiation or etching to carry out separation of the layer that is to be separated; a method in which a separation layer is formed between a formation substrate and a layer that is to be separated, a metal oxide film is provided between the separation layer and the layer that is to be separated, the metal oxide film is weakened by crystallization, and part of the separation layer is etched away using a solution or a halogen fluoride gas such as $NF_3$, $BrF_3$, or $ClF_3$ to carry out separation at the weakened metal oxide film; a method in which a formation substrate provided with a layer that is to be separated is mechanically removed or is etched away using a solution or a halogen fluoride gas such as $NF_3$, $BrF_3$, or $ClF_3$; or the like. Alternatively, it is also possible to use a method in which a film containing nitrogen, oxygen, hydrogen, or the like (e.g., an amorphous silicon film containing hydrogen, a film of an alloy containing hydrogen, or a film of an alloy containing oxygen) is used as a separation layer, which is irradiated with a laser beam so that nitrogen, oxygen, or hydrogen contained in the separation layer is released as a gas to promote separation between a layer that is to be separated and a substrate.

Further, the transfer step can be facilitated by using plural kinds of separation methods described above in combination.

In other words, separation may be performed by physical force (by a machine or the like) after a separation layer is irradiated with a laser beam, etched using a gas, a solution, or the like, or mechanically cut with a sharp knife so that the separation layer and a layer that is to be separated are easily separated from each other.

Alternatively, a layer that is to be separated from a separation layer may be separated from a formation substrate, after liquid is made to penetrate an interface between the separation layer and the layer that is to be separated, or while liquid such as water is poured into this interface.

Still alternatively, when the separation layer 201 is formed using tungsten, it is preferable that the separation be performed while etching the separation layer using a mixed solution of an ammonium hydroxide and oxygenated water.

Next, the lower support 110 is adhered to the exposed surface of the element formation layer 116 with the first adhesive layer 111. The lower support 110 is not adhered to the region where the external connection terminal is to be provided; thus, the electrode 131 is exposed at this time. After that, the external connection terminal 132 electrically connected to the electrode 131 is formed, and then the external connection portion 133 is connected to the external connection terminal 132, whereby the light-emitting device of this embodiment which is illustrated in FIG. 1A can be fabricated (see FIG. 2E). Alternatively, without provision of the external connection terminal 132, an exposed portion of the electrode 131 may be used as an external connection terminal.

As a material for the first adhesive layer 111, any of a variety of curable adhesives, such as a reactive curable adhesive, a thermal curable adhesive, a photo curable adhesive such as an ultraviolet curable adhesive, or an anaerobic adhesive can be used.

As the lower support 110, a flexible film or substrate formed of any of the following materials can be used: an acrylic resin, a polyester resin such as polyethylene terephthalate (PET) or polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinylchloride resin, metal, and the like.

Over the lower support 110, a protective layer having low permeability may be formed in advance, and examples thereof include a film containing nitrogen and silicon such as a film containing silicon nitride or silicon oxynitride, a film containing nitrogen and aluminum such as a film containing aluminum nitride, and the like.

Note that the upper support 122, the lower support 110, the first adhesive layer 111, and the second adhesive layer 121 may include a fibrous body therein. The fibrous body is a high-strength fiber of an organic compound or an inorganic compound. A high-strength fiber is specifically a fiber with a high tensile modulus of elasticity or a fiber with a high Young's modulus. Typical examples of high-strength fibers include a polyvinyl alcohol based fiber, a polyester based fiber, a polyamide based fiber, a polyethylene based fiber, an aramid based fiber, a polyparaphenylene benzobisoxazole fiber, a glass fiber, and a carbon fiber. As the glass fiber, a glass fiber using E glass, S glass, D glass, Q glass, and the like are given. These fibers may be used in a state of a woven fabric or a nonwoven fabric, and impregnated with an organic resin, and the organic resin is cured to obtain a structure body. This structure body may be used as the upper support or lower support. When the structure body including the fibrous body and the organic resin is used as the upper support or lower support, reliability of the element against bending or local pressure can be increased, which is preferable.

In the case where the substrate or the adhesive layer in the direction where light emitted from the light-emitting element is extracted includes the above-mentioned fibrous body, in order to reduce prevention of light emitted from the light-emitting element to the outside, the fibrous body is preferably a nanofiber with a diameter of less than or equal to 100 nm. Alternatively, refractive indexes of the fibrous body and the organic resin or the adhesive preferably match with each other.

In addition, the structure body obtained by the process in which the fibrous body is impregnated with the organic resin and the organic resin is cured can also be used to serve as both the first adhesive layer 111 and the lower support 110 or both the second adhesive layer 121 and the upper support 122. At this time, as the organic resin for the structure body, a reactive curable resin, a thermal curable resin, a UV curable resin, or the like which is better cured by additional treatment is preferably used.

Figure 3A:
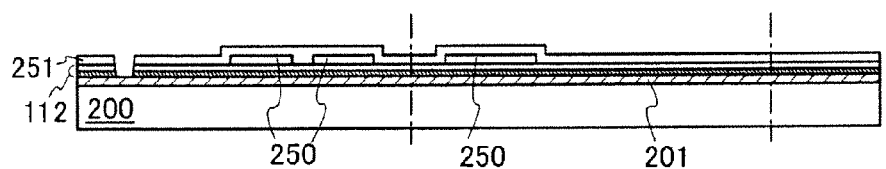
FIGS. 3A to 3C illustrate a manufacturing process of a light-emitting device described in Embodiment 1.
Figure 3B:
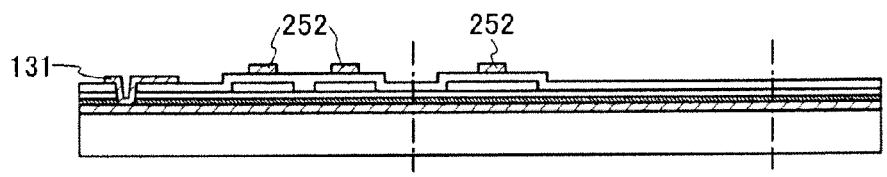
Figure 3C:
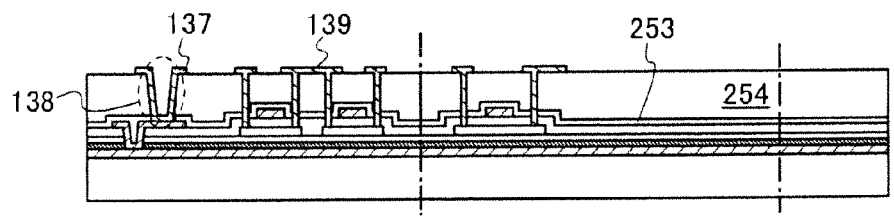

Next, another example of the method for manufacturing the light-emitting device in this embodiment is described with reference to FIGS. 3A to 3C.

The base insulating film 112 located over the formation substrate 200 with the separation layer 201 interposed therebetween and the semiconductor layer 250 and gate insulating film 251 located over the base insulating film 112 are formed in a manner similar to that of the above-described steps. After the gate insulating film 251 is formed, by patterning and etching, a through-hole is formed in the gate insulating film 251 and the base insulating film 112 (see FIG. 3A).

After that, the electrode 131 in the through-hole and the gate electrode 252 are formed (see FIG. 3I). The electrode 131 and the gate electrode 252 may be formed in the same step or using different materials in different steps. Note that the gate electrode 252 may be formed before the formation of the through-hole. In such a case, the protective insulating film 253 may be formed over the gate electrode 252, and then the through-hole is formed in the protective insulating film 253, the gate insulating film 251, and the base insulating film 112.

Further, by forming the electrode 131 after oxidation treatment by O2 ashing or the like on the exposed surface of the separation layer 201, adhesion between the electrode 131 and the separation layer 201 can be reduced to facilitate the separation in a later separation step.

After the electrode 131 and the gate electrode 252 are formed, the protective insulating film 253 and the interlayer insulating film 254 are formed as in the above-described step. Then, by patterning and etching, contact holes reaching the semiconductor layer 250 of the TFT are formed in the interlayer insulating film 254, the protective insulating film 253, and the gate insulating film 251, and a contact hole 138 reaching the electrode 131 is formed in the interlayer insulating film 254 and the protective insulating film 253. Then, the electrode 137 connected to the electrode 131, the electrode 139 which is the wiring electrode of the TFT, and the like are formed (see FIG. 3C).

The light-emitting device illustrated in FIG. 1B can be fabricated by the above-described steps after the formation of the electrode 137 and the electrode 139.

Figure 4A:
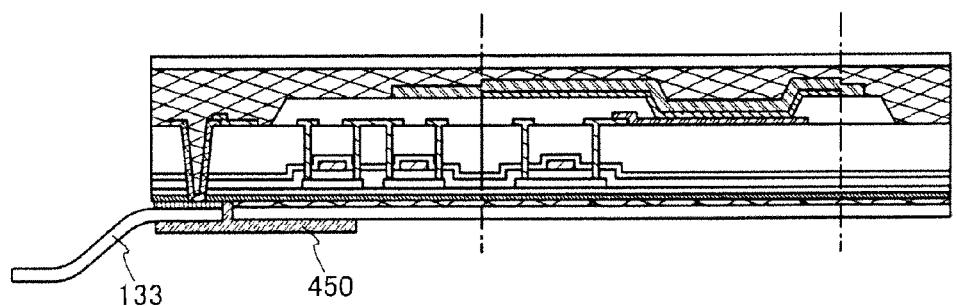
FIGS. 4A and 4B each illustrate a light-emitting device described in Embodiment 1.

Note that in order to reinforce the external connection portion 133, a protective member 450 is preferably provided to cover the lower support 110 and the external connection portion 133, as illustrated in FIG. 4A. The protective member 450 can be formed using an epoxy resin, an acrylic resin, a silicone resin, or the like.

Figure 4B:
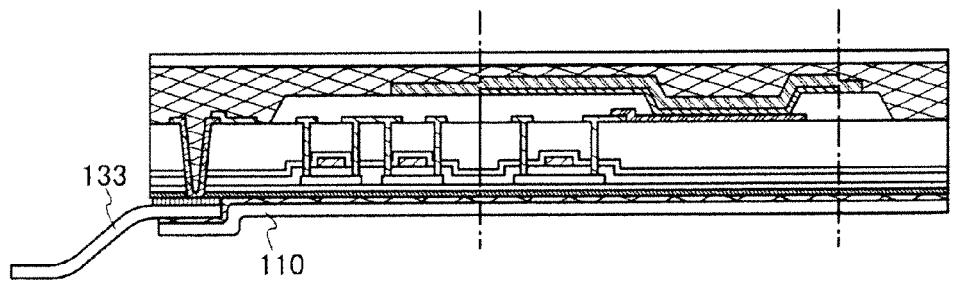

Alternatively, in the case where the external connection portion 133 is connected to the light-emitting device before the lower support is adhered, the external connection portion can be protected in such a manner that the lower support 110 is adhered so as to cover a surface of the external connection portion 133, as in FIG. 4B. In this case, the lower support is provided to cover at least part of the external connection portion.

Figure 5A:
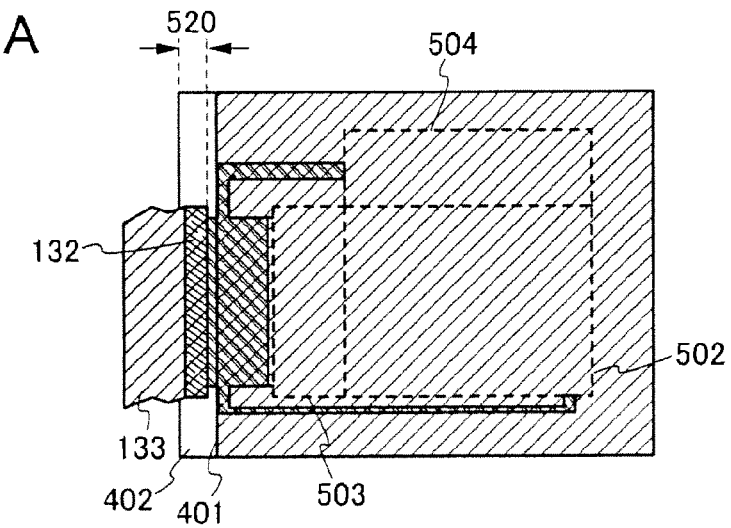
FIGS. 5A to 5C each illustrate a light-emitting device described in Embodiment 1.
Figure 5B:
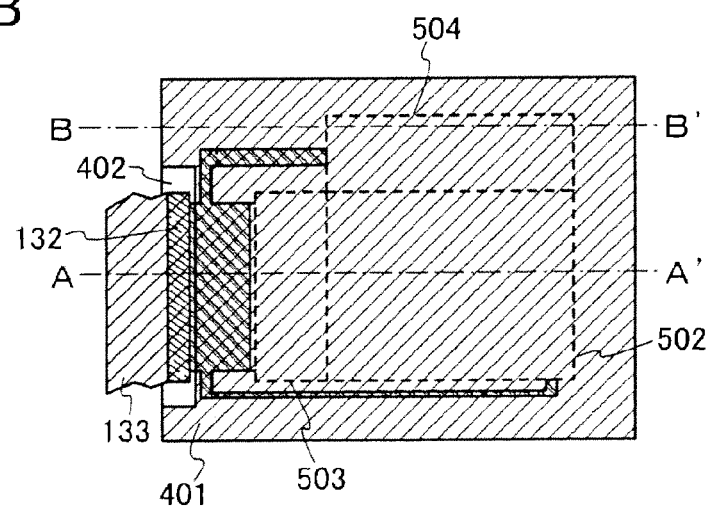
Figure 5C:
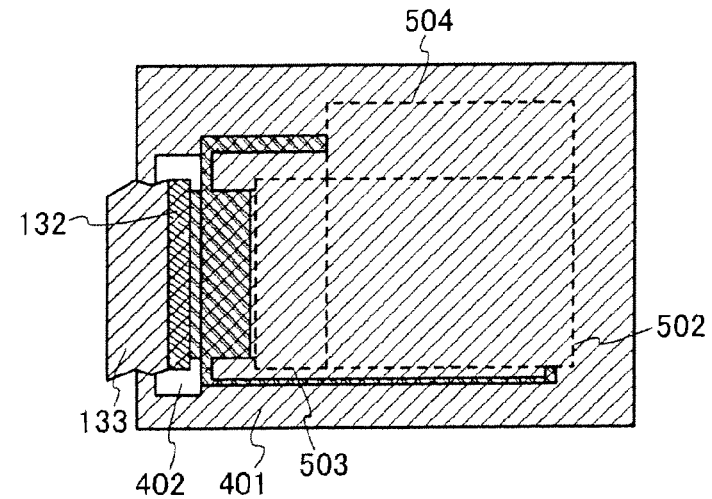

Then, FIGS. 5A to 5C are views each illustrating a module of the light-emitting device (also referred to as an EL module) seen from the lower support side. In FIGS. 5A to 5C, a pixel portion 502, a source side driver circuit 504, and a gate side driver circuit 503 are formed over the first adhesive layer and the lower support 401. Further, reference numeral 402 indicates a region where the element formation layer, the second adhesive layer, and the upper support are provided. The external connection terminal 132 and the external connection portion 133 connected thereto are provided in a region that is on the lower support side of the element formation layer and not covered with the lower support. These pixel portion and driver circuits can be fabricated according to the above manufacturing method.

Note that FIG. 5A illustrates an example in which the lower support has a lateral length shorter than the upper support by the distance (indicated by reference numeral 520 in FIG. 5A) between the side of the light-emitting device which is close to the external connection terminal and the side of the external connection terminal which is nearer to the center of the light-emitting device. FIG. 5B illustrates an example in which the lower support has a notch in the region where the external connection terminal is provided. FIG. 5C illustrates an example in which the lower support has an opening portion in the region where the external connection terminal is provided.

Figure 6A:
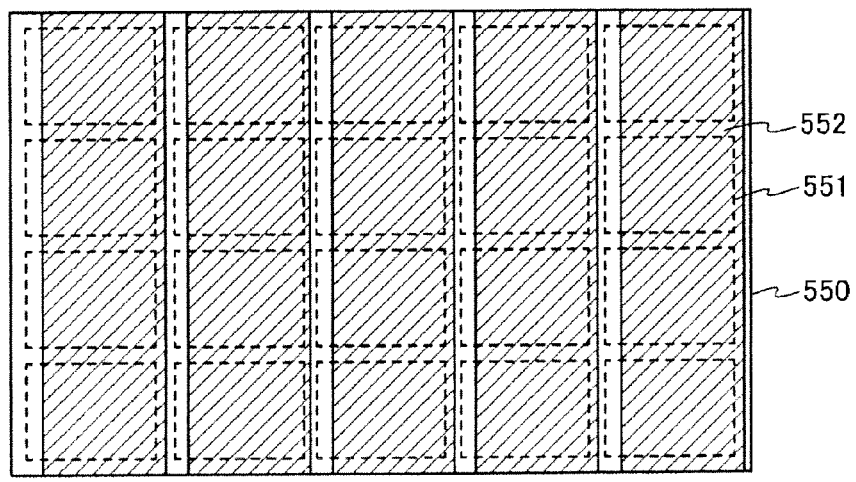
FIGS. 6A to 6C each illustrate a light-emitting device described in Embodiment 1.
Figure 6B:
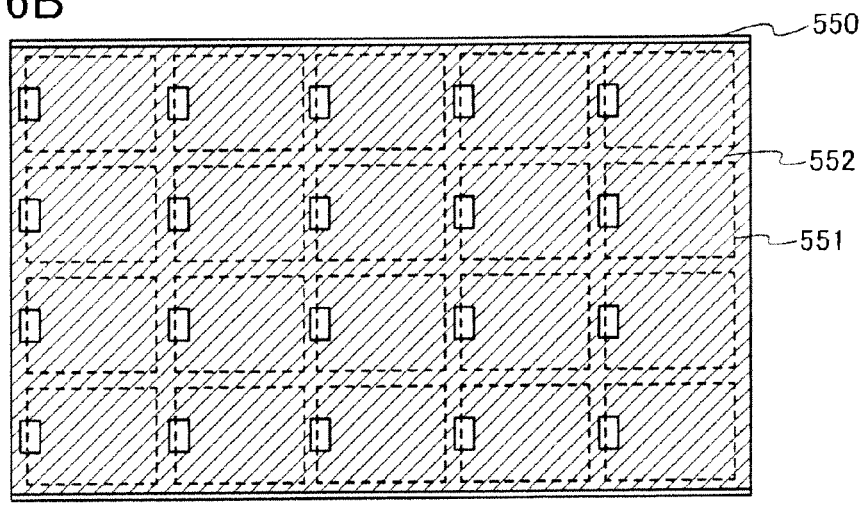
Figure 6C:
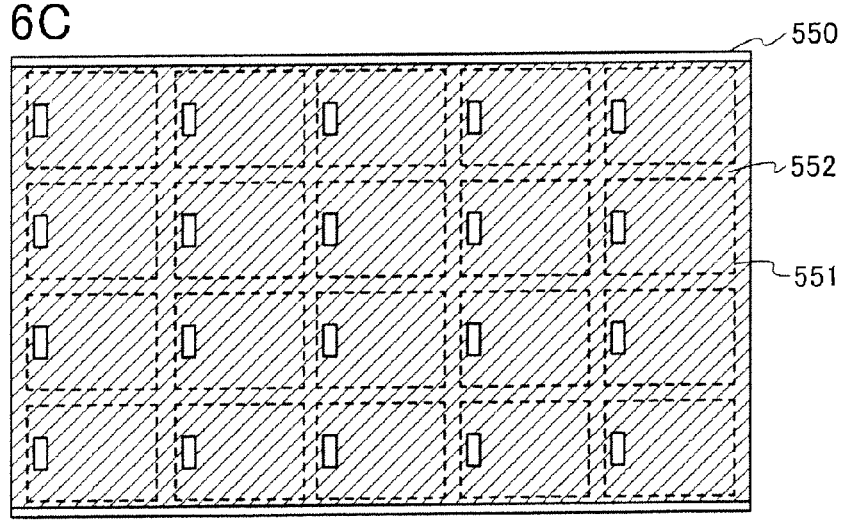

FIGS. 6A to 6C exemplify patterns of adhering the lower support for forming multiple light-emitting devices of the structure described in this embodiment from a large-sized substrate. Each figure illustrates the upper support 550 to which the element formation layer corresponding to the multiple light-emitting devices is transferred, portions 551 each of which forms a light-emitting device after division, and the lower support 552. Note that FIGS. 6A, 6B, and 6C correspond to FIGS. 5A, 5B, and 5C, respectively. Patterning the lower support so as to be rolled up in advance, for example, facilitates automation of the step of adhering the lower support. Further, the light-emitting device described in this embodiment enables connecting the external connection portion to follow adhering the lower support. Thus, after the lower support is adhered and the multiple light-emitting devices are obtained by the division, the external connection portion can be connected. This is a process which is an important key to mass production of light-emitting devices.

The reason of the above importance is explained below. In the manufacture of medium- or small-sized light-emitting devices, forming multiple devices from a large-sized substrate is necessary for cost reduction. However, forming multiple light-emitting devices from a large-sized substrate is extremely difficult if the light-emitting device has a structure in which the external connection terminal is not provided on the lower support side of the element formation layer. This is because, for such a structure, the external connection portion needs to be connected before the upper support is adhered. In contrast, in the light-emitting device described in this embodiment, the external connection terminal is provided on the lower support side of the element formation layer. Accordingly, forming multiple light-emitting devices from a large-sized substrate can be realized, which contributes to mass production and cost reduction.

Further, the light-emitting devices illustrated in FIGS. 5A to 5C have a structure that enables the external connection portion to be connected after the lower support is adhered, in which the external connection terminal is provided in the region that is on the lower support side of the element formation layer and not covered with the lower support. In the case where multiple light-emitting devices having such a structure are formed, the external connection portion can be connected after division into individual light-emitting devices. Thus, the division in this case is much easier than in the case where division into individual light-emitting devices is performed after provision of the external connection portion. Therefore, such a structure is preferable because of its suitability for mass production and automation.

Figure 7A:
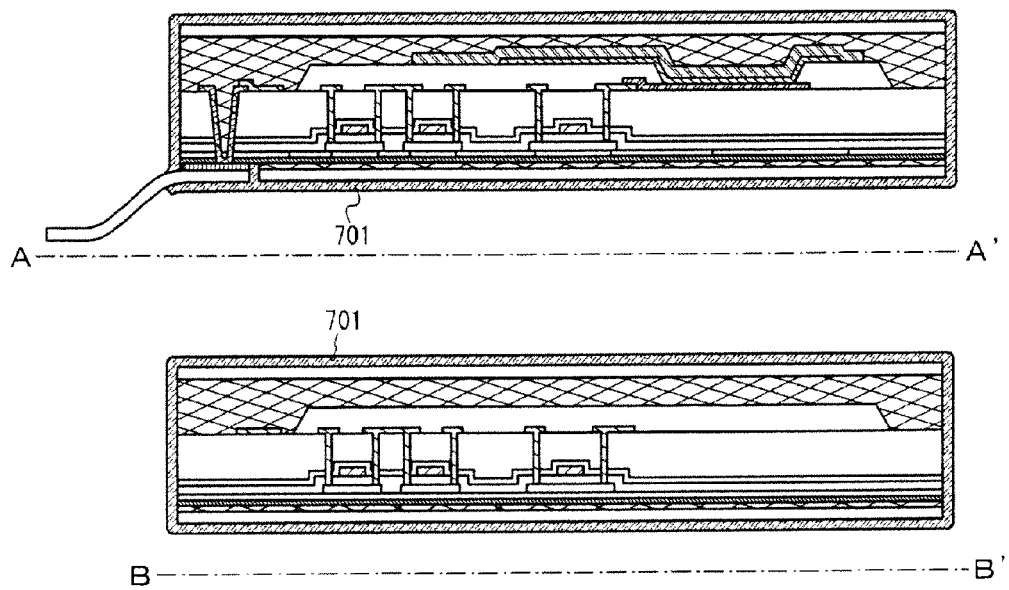
FIGS. 7A and 7B each illustrate a light-emitting device described in Embodiment 1.
Figure 7B:
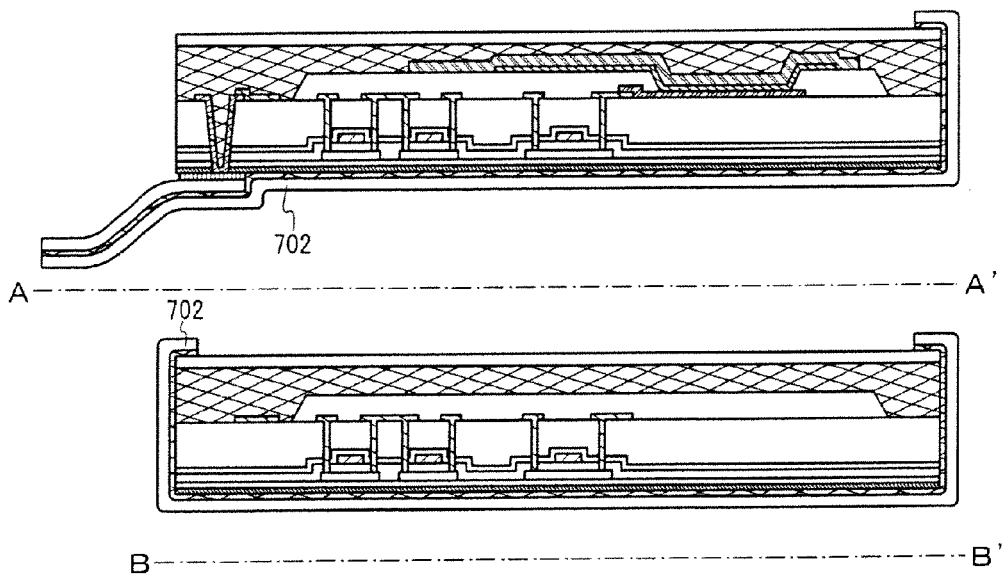

FIGS. 7A and 7B are cross-sectional views of the example of the light-emitting device illustrated in FIG. 5B taken along the line A-A' and the line B-B', exemplifying the protective member protecting the light-emitting device and the external connection portion.

The light-emitting device illustrated in FIG. 7A, where the steps up to the connection of the external connection portion have been completed, is covered with an organic resin that has fluidity and transmits visible light. The organic resin is then dried, thereby forming a protective member 701. The protective member 701 can play a role in protecting not only the external connection portion but also the upper support and the lower support from damage. As materials that can be used as the protective member 701, there are an epoxy resin, an acrylic resin, a silicone resin, a variety of hard coating materials, and the like.

FIG. 7B illustrates an example of a method of adhering a lower support 702 serving as a protective member. After the external connection portion is formed, an adhesive agent is provided to cover a surface of the external connection portion, with which the lower support is adhered. The protection of the external connection portion can be enhanced by notching and rolling up the portion of the lower support which sticks out of the external connection portion so as to cover a side of the light-emitting device and to reach the upper support, as illustrated in the cross section taken along the line B-B'. Note that a protective member like the lower support 702 illustrated in FIG. 7B may be provided, after the steps in which the external connection terminal is exposed to adhere the lower support and then the external connection portion is connected.

The light-emitting device described above has a structure that can facilitate provision of the external connection portion. This indicates that the light-emitting device is suitable for mass production.

(Embodiment 2)

In this embodiment, an electronic device including the light-emitting device described in Embodiment 1 as a part thereof will be described.

Examples of the electronic device including the light-emitting element described in Embodiment 1 include cameras such as video cameras or digital cameras, goggle type displays, navigation systems, audio playback devices (e.g., car audio systems and audio systems), computers, game machines, portable information terminals (e.g., mobile computers, mobile phones, portable game machines, and electronic book devices), image playback devices in which a recording medium is provided (specifically, devices that are capable of playing back recording media such as digital versatile discs (DVDs) and equipped with a display unit that can display images), and the like. Such electronic devices are illustrated in FIGS. 8A to 8E.

Figure 8A:
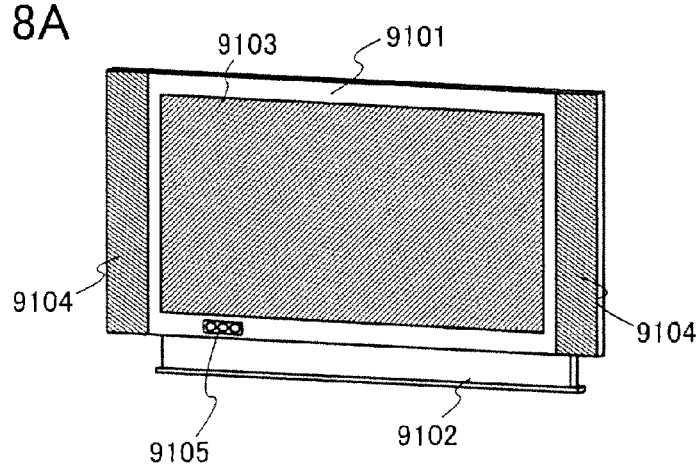
FIGS. 8A to 8E each illustrate an electronic device described in Embodiment 2.

FIG. 8A illustrates a television receiver. The television receiver illustrated in FIG. 8A includes a housing 9101, a support 9102, a display portion 9103, speaker portions 9104, video input terminals 9105, and the like. In this television receiver, the display portion 9103 is manufactured using the light-emitting device described in Embodiment 1. The television receiver is provided with the light-emitting device described in Embodiment 1 which has flexibility and long lifetime and is easy to manufacture. This television receiver can be a relatively inexpensive product while the display portion 9103 can be curved and lightweight.

Figure 8B:
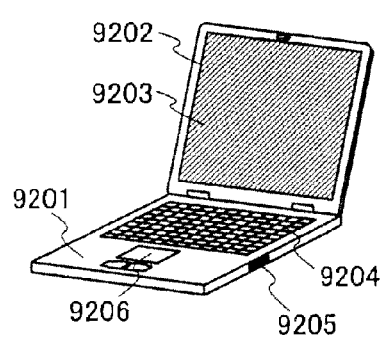

FIG. 8B illustrates a computer. The computer illustrated in FIG. 8B includes a main body 9201, a housing 9202, a display portion 9203, a keyboard 9204, an external connection port 9205, a pointing device 9206, and the like. In this computer, the display portion 9203 is manufactured using the light-emitting device described in Embodiment 1. The computer is provided with the light-emitting device described in Embodiment 1 which has flexibility and long lifetime and is easy to manufacture. This computer can be a relatively inexpensive product while the display portion 9203 can be curved and lightweight.

Figure 8C:
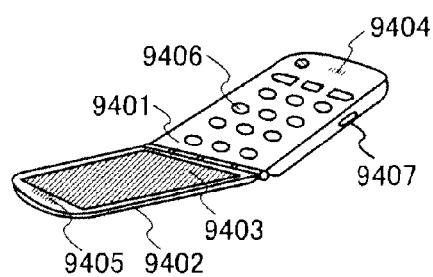

FIG. 8C illustrates a mobile phone. The mobile phone illustrated in FIG. 8C includes a main body 9401, a housing 9402, a display portion 9403, an audio input portion 9404, an audio output portion 9405, operation keys 9406, an external connection port 9407, and the like. In this mobile phone, the display portion 9403 is manufactured using the light-emitting device described in Embodiment 1. The mobile phone is provided with the light-emitting device described in Embodiment 1 which has flexibility and long lifetime and is easy to manufacture. This mobile phone can be a relatively inexpensive product while the display portion 9403 can be curved and lightweight. The lightweight mobile phone of this embodiment can have a weight light enough to be carried even with additional values, thereby being suitable as a multifunctional mobile phone.

Figure 8D:
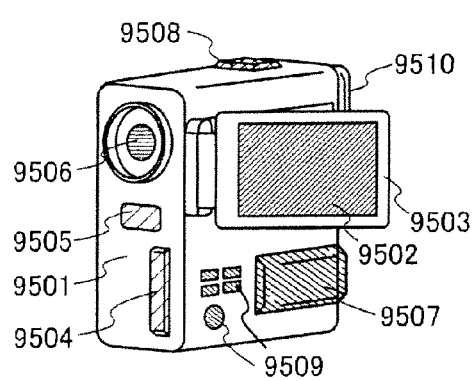

FIG. 8D illustrates a camera. The camera illustrated in FIG. 8D includes a main body 9501, a display portion 9502, a housing 9503, an external connection port 9504, a remote control receiving portion 9505, an image receiving portion 9506, a battery 9507, an audio input portion 9508, operation keys 9509, an eyepiece portion 9510, and the like. In this camera, the display portion 9502 is manufactured using the light-emitting device described in Embodiment 1. The camera is provided with the light-emitting device described in Embodiment 1 which has flexibility and long lifetime and is easy to manufacture. This camera can be a relatively inexpensive product while the display portion 9502 can be curved and lightweight.

Figure 8E:
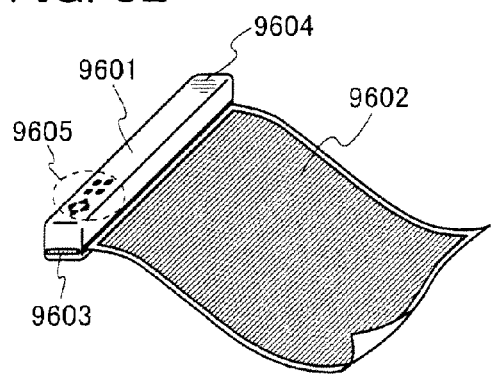

FIG. 8E illustrates a display. The display illustrated in FIG. 8E includes a main body 9601, a display portion 9602, an external memory insertion portion 9603, a speaker portion 9604, operation keys 9605, and the like. The main body 9601 may be provided with an antenna for receiving a television broadcast, an external input terminal, an external output terminal, a battery, and the like. In this display, the display portion 9602 is manufactured using the light-emitting device described in Embodiment 1. The flexible display portion 9602 can be rolled up and stored in the main body 9601 and is suitable for being carried. The display is provided with the light-emitting device described in Embodiment 1 which has flexibility and long lifetime and is easy to manufacture. The display portion 9602 can be suitable for being carried and is lightweight, and thus the display can be a relatively inexpensive product.

As described above, the application range of the light-emitting device described in Embodiment 1 is so wide that the light-emitting device can be applied to electronic devices of various fields.

This application is based on Japanese Patent Application serial no. 2008-320939 filed with Japan Patent Office on Dec. 17, 2008, the entire contents of which are hereby incorporated by reference.

What is claimed is:

1. A light-emitting device comprising:
   a first flexible support;
   an element formation layer over the first flexible support with a first adhesive layer interposed therebetween, the element formation layer comprising a transistor, a first insulating film, a light-emitting element, and a second insulating film;
   an electrode configured to be electrically connected to an external connection portion; and
   a second flexible support over the element formation layer with a second adhesive layer interposed therebetween,
   wherein the second insulating film is over the first insulating film,
   wherein the first insulating film comprises a first opening portion,
   wherein the electrode is provided in the first opening portion,
   wherein the electrode does not overlap the second insulating film,
   wherein the second insulating film comprises a second opening portion, and
   wherein the light-emitting element is provided in the second opening portion.

2. The light-emitting device according to claim 1, wherein the electrode overlaps the second adhesive layer.

3. The light-emitting device according to claim 1, wherein the electrode does not overlap the first adhesive layer.

4. The light-emitting device according to claim 1, wherein the electrode is in contact with the second adhesive layer.

5. The light-emitting device according to claim 1, wherein the first insulating film comprises an organic material selected from the group consisting of acrylic, polyimide, polyamide, polyimideamide, and benzocyclobutene.

6. The light-emitting device according to claim 1, further comprising a protective member,
   wherein the protective member is in contact with side surfaces of the first flexible support and the second flexible support.

7. The light-emitting device according to claim 1, wherein at least one of the first flexible support and the second flexible support comprises aramid.

8. The light-emitting device according to claim 1, wherein at least one of the first adhesive layer and the second adhesive layer comprises a fibrous body.

9. An electronic device comprising the light-emitting device according to claim 1.

10. The electronic device according to claim 9, wherein the electronic device is a portable information terminal.

11. A light-emitting device comprising:
    a first flexible support;
    an element formation layer over the first flexible support with a first adhesive layer interposed therebetween, the element formation layer comprising a transistor, a first insulating film, a light-emitting element, and a second insulating film;
    an electrode configured to be electrically connected to an external connection portion;

a second flexible support over the element formation layer with a second adhesive layer interposed therebetween;

a protective member in contact with side surfaces of the first flexible support and the second flexible support, wherein the second insulating film is over the first insulating film, wherein the first insulating film comprises a first opening portion, wherein the electrode is provided in the first opening portion, wherein the electrode does not overlap the second insulating film, wherein the second insulating film comprises a second opening portion, and wherein the light-emitting element is provided in the second opening portion.

12. The light-emitting device according to claim 11, wherein the electrode overlaps the second adhesive layer.

13. The light-emitting device according to claim 11, wherein the electrode does not overlap the first adhesive layer.

14. The light-emitting device according to claim 11, wherein the electrode is in contact with the second adhesive layer.

15. The light-emitting device according to claim 11, wherein the first insulating film comprises an organic material selected from the group consisting of acrylic, polyimide, polyamide, polyimideamide, and benzocyclobutene.

16. The light-emitting device according to claim 11, wherein at least one of the first flexible support and the second flexible support comprises an aramid.

17. The light-emitting device according to claim 11, wherein at least one of the first adhesive layer and the second adhesive layer comprises a fibrous body.

18. An electronic device comprising the light-emitting device according to claim 11.

19. The electronic device according to claim 18, wherein the electronic device is a portable information terminal.

* * * * *